(12) United States Patent
Yan et al.

(10) Patent No.: US 11,769,616 B2
(45) Date of Patent: Sep. 26, 2023

(54) ITEMS WITH MAGNETIC STRAPS AND CABLES

(71) Applicant: Apple Inc., Cupertino, CA (US)

(72) Inventors: Toria F. Yan, San Jose, CA (US); Liam R. Martinez, Sunnyvale, CA (US); Yi H. Hsieh, Union City, CA (US); Yunhe Huang, Pleasanton, CA (US); Zebinah P. Masse, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/210,106

(22) Filed: Mar. 23, 2021

(65) Prior Publication Data

US 2021/0350963 A1 Nov. 11, 2021

Related U.S. Application Data

(60) Provisional application No. 63/022,136, filed on May 8, 2020.

(51) Int. Cl.
*H05K 5/02* (2006.01)
*H01F 7/02* (2006.01)
*H01B 7/04* (2006.01)

(52) U.S. Cl.
CPC ............ *H01F 7/02* (2013.01); *H01B 7/04* (2013.01); *H05K 5/0217* (2013.01)

(58) Field of Classification Search
USPC ........................................ 361/807, 809, 810
See application file for complete search history.

(56) References Cited

U.S. PATENT DOCUMENTS

| | | | |
|---|---|---|---|
| 3,229,030 A | 1/1966 | Baermann | |
| 5,581,271 A | 12/1996 | Kraemer | |
| 6,148,500 A * | 11/2000 | Krone | H01F 41/041 336/200 |
| 6,301,754 B1 * | 10/2001 | Grunberger | A41F 1/002 24/303 |
| 6,369,952 B1 | 4/2002 | Rallison et al. | |
| 6,998,538 B1 | 2/2006 | Fetterolf, Sr. et al. | |

(Continued)

FOREIGN PATENT DOCUMENTS

| CN | 207460482 U | | 6/2018 | |
|---|---|---|---|---|
| CN | 112735664 | * | 4/2021 | ............... H01B 9/02 |

(Continued)

*Primary Examiner* — Hung S. Bui
(74) *Attorney, Agent, or Firm* — TREYZ LAW GROUP, P.C.; G. Victor Treyz; David K. Cole

(57) ABSTRACT

Cables are magnetically attracted to magnets in straps and other items such as electronic devices. The cables may contain signal lines to convey power and/or data. Magnetic material that is attracted to magnetic fields may be incorporated into the signal lines and/or other structures in the cables. The straps may have flexible magnets and/or other magnets extending along their lengths. The magnets of the straps create magnetic fields that attract the cables. Electronic devices may also have housings that contain magnets to attract the cables. Using magnetic attraction, cables can be removably attached to straps and other items during operation of an electronic device, thereby helping to prevent tangling of the cables.

25 Claims, 10 Drawing Sheets

(56) References Cited

U.S. PATENT DOCUMENTS

| | | | |
|---|---|---|---|
| 7,807,928 B1 * | 10/2010 | Tate | H02G 3/0487 |
| | | | 174/110 R |
| 8,225,465 B2 | 7/2012 | Honeycutt | |
| 8,841,556 B2 | 9/2014 | Rothbaum | |
| 9,445,178 B2 | 9/2016 | Rothbaum et al. | |
| 10,045,440 B1 | 8/2018 | Schultz | |
| 10,463,119 B1 | 11/2019 | Chambers et al. | |
| 2009/0314515 A1 | 12/2009 | Bevirt et al. | |
| 2011/0253571 A1 | 10/2011 | Rothbaum | |
| 2013/0291394 A1 * | 11/2013 | Shami | A45D 20/10 |
| | | | 34/88 |
| 2013/0298356 A1 | 11/2013 | Scandora | |
| 2014/0010400 A1 | 1/2014 | Morris | |
| 2015/0170798 A1 | 6/2015 | Chen et al. | |
| 2018/0329209 A1 | 11/2018 | Nattukallingal | |
| 2020/0012352 A1 * | 1/2020 | Yang | G06F 3/02 |
| 2020/0020308 A1 | 1/2020 | Deering et al. | |
| 2020/0042098 A1 | 2/2020 | Joo | |
| 2020/0314520 A1 * | 10/2020 | Rhondeau | H04R 1/1016 |

FOREIGN PATENT DOCUMENTS

| | | | | |
|---|---|---|---|---|
| CN | 215600143 | * | 1/2022 | H01B 7/29 |
| GB | 2501909 | * | 10/2012 | G08B 21/02 |
| JP | H0587746 U | | 11/1993 | |

* cited by examiner

ITEMS WITH MAGNETIC STRAPS AND CABLES

This application claims the benefit of provisional patent application No. 63/022,136, filed May 8, 2020, which is hereby incorporated by reference herein in its entirety.

FIELD

This relates generally to electronic equipment, and, more particularly, to cable systems for electronic equipment.

BACKGROUND

Cables may be used to convey data and power between electronic devices. If care is not taken, however, cable systems may be cumbersome and difficult to use.

SUMMARY

Cables may be used to electrically couple electronic devices. The electronic devices may include cellular telephones, computers, battery packs, battery cases, accessories, head-mounted devices, speakers, and/or other electronic equipment.

Cables may contain signal lines to convey power and/or data. For example, a cable may contain a positive power supply line and a ground power supply line. Using these power lines, the cable may convey power from a battery in a first device to input-output devices and other circuitry in a second device. Data lines in a cable may be used to convey audio, video, and/or other data between electronic devices.

The electronic devices may have straps. The straps may be magnetic straps. Magnetic straps for the electronic devices may attract the cables, thereby helping to prevent cable tangling. The straps may have flexible magnets and/or other magnets extending along their lengths. The magnet of each magnetic strap creates a magnetic field that attracts magnetic material in cables. The magnetic material in a cable may form part of one or more of the signal lines in the cable and/or may be embedded in other structures such as polymer layers surrounding the core of the cable. If desired, electronic devices may also contain magnets to attract the cables.

To accommodate a variety of different users, straps may be provided with buckles and/or other structures that allow the lengths of the straps to be adjusted.

DETAILED DESCRIPTION

Electronic devices such as cellular telephones, head-mounted devices, computers, battery packs, headphones, and other devices may sometimes be interconnected using cabling. For example, cables may be used to convey power, may convey audio and video data, may convey control signals, and/other signals.

To help ensure that cables to not become unnecessarily entangled with themselves and other equipment, a magnetic cable management system may be provided. In an illustrative configuration, a cable is magnetically attracted to a strap, portions of an electronic device, or other structures. This can help prevent the cable from becoming tangled or from moving into unsightly or awkward configurations as the cable is used.

Figure 1:
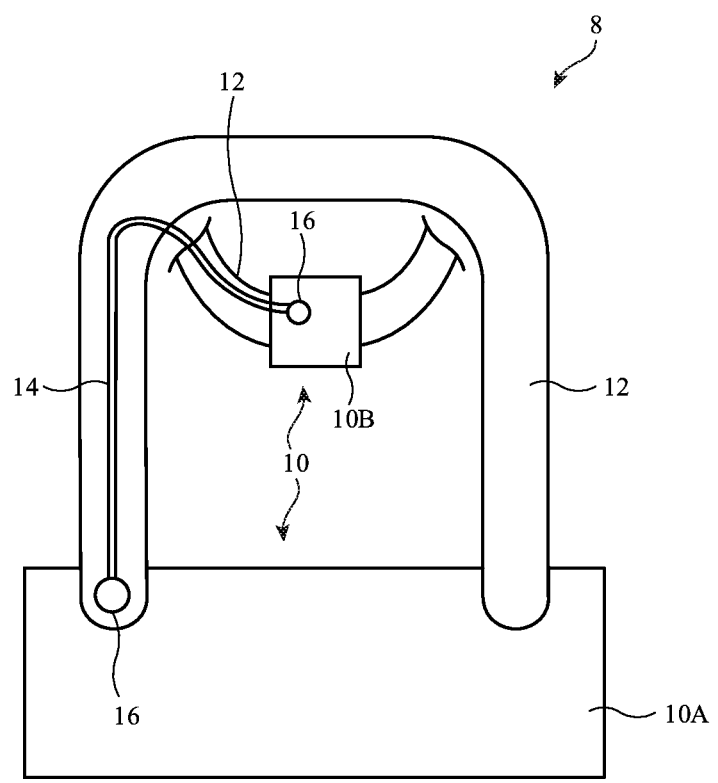
FIG. 1 is a schematic diagram of illustrative electronic equipment with a magnetic cable system in accordance with an embodiment.

An illustrative system with magnetic straps and a magnetic cable is illustrated in FIG. 1. System 8 of FIG. 1 may include one or more items such as electronic devices 10 and one or more associated cables such as 14. Electronic devices 10 may include computers, cellular telephones, head-mounted devices, wristwatch devices, battery packs, removable electronic device cases that include supplemental batteries, headphones and other accessories, speakers, wearable devices, and/or other electronic equipment. Configurations in which electronic devices 10 include a pair of devices such as first device 10A (e.g., a cellular telephone, an item with a supplemental battery such as a battery pack or battery case, etc.) and second device 10B (e.g., a head-mounted device such as a pair of goggles, a helmet, glasses, or other electronic device with a head-mounted housing that allows the device to be worn on a head of a user) may sometimes be described herein as an example.

It may be desirable to convey data and/or power between devices 10A and 10B. As an example, it may be desirable to provide battery power from device 10A to device 10B, thereby extending the battery life of a battery in device 10B or powering device 10B in configurations in which device 10B does not include an internal battery). As another example, it may be desirable to supply data (e.g., video and/or audio information) from device 10A to device 10B.

Devices 10 may be interconnected using one or more cables such as cable 14. Connectors 16 may be provided at one or both ends of cable 14. Connectors 16 may be used to mechanically and/or electrically couple cable to devices 10. Connectors 16 may include wired connectors (e.g., male and/or female connectors that mechanically and electrically engage with mating connectors in devices 10) and/or may include magnetic connectors or other connectors that contain wireless circuitry (e.g., connectors containing antennas and other wireless communications circuitry for transmitting and/or receiving wireless communications signals and/or connectors containing one or more coils for wirelessly transmitting power and/or wirelessly receiving power). Magnets and/or magnetic material in connectors 16 may be used to magnetically attach connectors 16 in place on devices 10. For example, magnets in connectors 16 may mate with corresponding magnets in devices 10. If desired, connectors 16 may be physically coupled to the housings of one or more devices 10 (e.g., using mating connector structures, by pigtailing cable 14 to one or more devices 10, etc.). Cables 14 may have signal and power lines for conveying data and/or power between devices 10 via connectors 16 or other physical and/or electrical connections.

Devices 10 may have straps such as straps 12. For example, device 10A may have a strap 12 (e.g., a carrying strap) that allows device 10A to be carried in a user's hand and/or worn over a user's neck or shoulder. Device 10B may have a strap 12 (e.g., a head-mounted strap) that fits around a user's head and therefore serves as part of a head-mounted support structure for device 10B (e.g., a strap and/or other support structure may be used to allow device 10B to be worn on a user's head so that the user can view virtual reality and/or mixed reality video content and/or listen to audio using device 10B).

Straps 12 may have detachable item-attachment magnets (e.g., each strap may have an item-attachment magnet at each of its opposing ends and/or elsewhere in the strap). The item-attachment magnets and/or physical connectors (e.g., snaps and/or other interlocking structures) may be used to removably attach straps 12 to items 10. If desired, one or both ends of each strap 12 may be permanently (or nearly permanently) attached to the housing of one or more items 10. For example, the strap attached to device 10B may be attached to the housing of device 10B without using magnets by running the strap through an opening in the housing of device 10B.

If desired, item-attachment magnets (and/or other magnetic structures in straps 12 and associated structures) may be flexible magnets (e.g., flexible magnets that attract corresponding flexible magnets on other straps, on other portions of a common strap, and/or on associated items 10). Discrete-magnet-to-flexible magnet arrangements may also be used in item-attachment magnetic structures and other structures (e.g., to increase magnetic force relative to flexible-magnet-to-flexible-magnet connections while avoiding the risk of undesired skipping sensations that could be present in some discrete-magnet-to-discrete-magnet arrangements).

To help hold cable 14 in place so that cable 14 does not become tangled with straps 12 and/or other structures, cable 14 and straps 12 may be configured to magnetically attract each other. By providing cable 14 and straps 12 with magnetic attraction capabilities (e.g., by providing cable 14 and/or straps 12 with permanent magnets and/or magnetic material that is attracted to magnetic fields produced by permanent magnets), cable 14 may be removably attached to straps 12. In an illustrative arrangement, device 10A may be worn by a user (e.g., around a user's neck or shoulder) while device 10B is being worn on a user's head. In this configuration, a user's vision of the surrounding environment may be restricted as the user is using device 10B (as an example), making it challenging for the user to manage cable 14. Nevertheless, due to the magnetic attraction between cable 14 and straps 12, cable 14 may be held in place against the strap of device 10A so that cable 14 may run from the user's waist to a position adjacent to the user's head. At the user's head, cable 14 may then transition from the strap of device 10A to the strap of device 10B. The magnetic attraction between cable 14 and the strap of device 10B may help hold cable 14 in place as the user's head is moved and device 10B moves accordingly.

Figure 2:
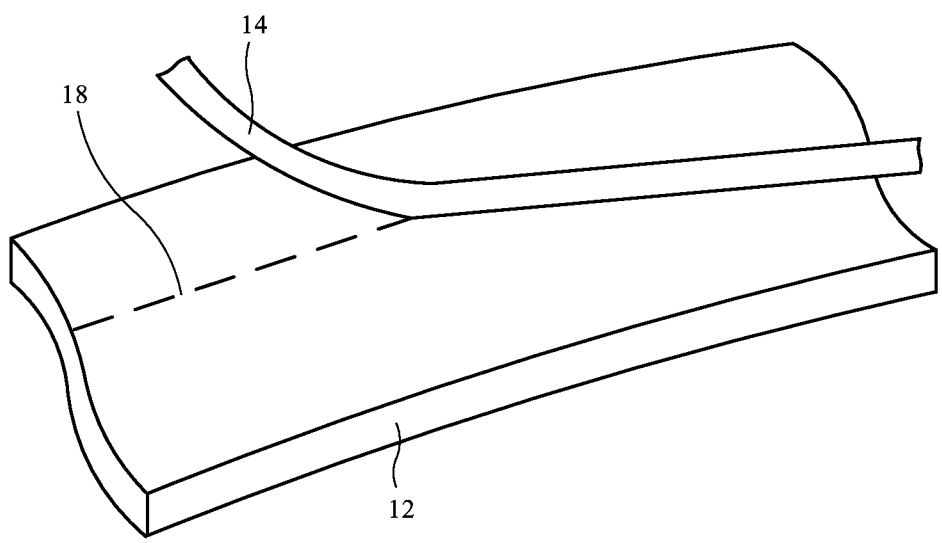
FIG. 2 is a perspective view of an illustrative magnetic cable system with a strap and cable in accordance with an embodiment.

Straps 12 may have any suitable shape. For example, straps 12 may be circular in cross-sectional shape, may have oval cross-sectional profiles, may have rectangular cross-sectional profiles, etc. In an illustrative configuration, straps 12 are relatively planar. Planar straps, which may sometimes be referred to as flat straps, may have thin rectangular cross-sectional shapes that can lie flat against a user's body, which helps enhance user comfort as straps 12 are worn against the user's body An illustrative flat strap is shown in FIG. 2. As shown in FIG. 2, cable 14 may be magnetically attracted to strap 12. When a user applies sufficient force (e.g., when a user pulls cable 14 away from strap 12 and/or when cable 14 is transitioning between adjacent straps 12), cable 14 can detach from strap 12. In other locations, the magnetic attraction between cable 14 and strap 12 removably attaches cable 14 to strap 12. To help center cable 14 on strap 12, a narrow strip of magnets (e.g., a magnetic strip having a width less than the width of strap 12) may extend along dashed line 18 in the center of strap 12 and/or strap 12 may be provided with a groove running along dashed line 18. Cable 14 may have a cross-sectional shape that is received within the groove (as an example). In general, cable 14 may be have a circular cross-sectional shape, an oval cross-sectional shape, a rectangular (flat) cross-sectional shape, and/or other shapes. Configurations in which cable 14 is circular or flat may sometimes be described herein as examples.

Figure 3:
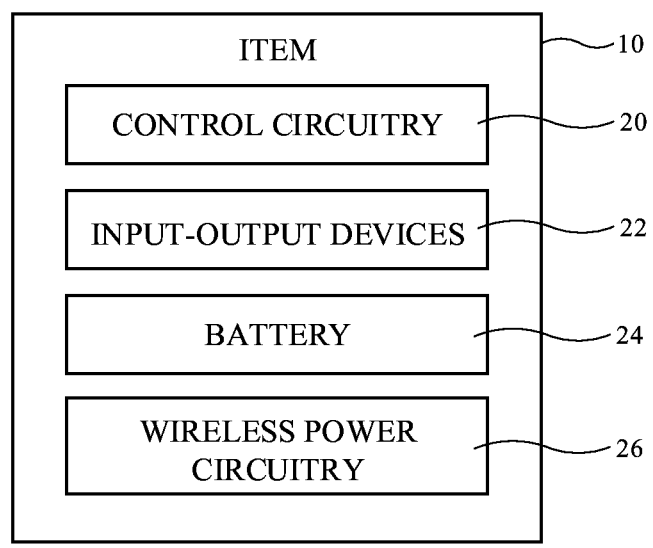
FIG. 3 is a schematic diagram of an illustrative item such as an electronic device in accordance with an embodiment.

FIG. 3 is a schematic diagram of an illustrative electronic device of the type that may be used with cable 14 (e.g., device 10A and/or device 10B of FIG. 1). As shown in FIG. 3, electronic devices such as electronic device 10 may have control circuitry 20. Control circuitry 20 may include storage and processing circuitry for controlling the operation of device 10. Circuitry 20 may include storage such as hard disk drive storage, nonvolatile memory (e.g., electrically-programmable-read-only memory configured to form a solid-state drive), volatile memory (e.g., static or dynamic random-access-memory), etc. Processing circuitry in control circuitry 20 may be based on one or more microprocessors, microcontrollers, digital signal processors, baseband processors, power management units, audio chips, graphics processing units, application specific integrated circuits, and other integrated circuits. Software code may be stored on storage in circuitry 20 and run on processing circuitry in circuitry 20 to implement control operations for device 10 (e.g., data gathering operations, operations involving the adjustment of the components of device 10 using control signals, etc.). Control circuitry 20 may include wired and wireless communications circuitry. For example, control circuitry 20 may include radio-frequency transceiver circuitry such as cellular telephone transceiver circuitry, wireless local area network transceiver circuitry (e.g., WiFi® circuitry), millimeter wave transceiver circuitry, and/or other wireless communications circuitry.

During operation, the communications circuitry of the devices in system 8 of FIG. 1 (e.g., the communications circuitry of control circuitry 20 of device 10), may be used to support communication between the electronic devices. For example, one electronic device may transmit video data, audio data, and/or other data to another electronic device in system 8. Electronic devices in system 8 may use wired and/or wireless communications circuitry to communicate through cable 14 and/or through one or more communications networks (e.g., the internet, local area networks, etc.). The communications circuitry may be used to allow data to be received by device 10 from external equipment (e.g., a tethered computer, a portable device such as a handheld device or laptop computer, online computing equipment such as a remote server or other remote computing equipment, or other electrical equipment) and/or to provide data to external equipment. In addition to or instead of carrying data between devices 10, cable 14 may be used to carry power between devices 10.

Device 10 may include input-output devices 22. Input-output devices 22 may be used to allow a user to provide device 10 with user input. Input-output devices 22 may also be used to gather information on the environment in which device 10 is operating. Output components in devices 22 may allow device 10 to provide a user with output and may be used to communicate with external electrical equipment.

In some embodiments, input-output devices 22 may include one or more displays. In other embodiments, device 10 may be a displayless device that does not contain any displays. In arrangements in which device 10 includes displays, device 10 may include left and right display devices (e.g., when device 10B of FIG. 1 is a head-mounted device). Device 10 may for example, include left and right display components such as left and right scanning mirror display devices or other image projectors, liquid-crystal-on-silicon display devices, digital mirror devices, or other reflective display devices, left and right display panels based on light-emitting diode pixel arrays such as organic light-emitting display panels or display devices based on pixel arrays formed from crystalline semiconductor light-emitting diode dies, liquid crystal display panels, and/or other left and right display devices that provide images to left and right eye boxes for viewing by the user's left and right eyes, respectively.

Input-output devices 22 may include sensors. Sensors in devices 22 may include, for example, three-dimensional sensors (e.g., three-dimensional image sensors such as structured light sensors that emit beams of light and that use two-dimensional digital image sensors to gather image data for three-dimensional images from light spots that are produced when a target is illuminated by the beams of light, binocular three-dimensional image sensors that gather three-dimensional images using two or more cameras in a binocular imaging arrangement, three-dimensional lidar (light detection and ranging) sensors, three-dimensional radio-frequency sensors, or other sensors that gather three-dimensional image data), cameras (e.g., infrared and/or visible digital image sensors), gaze tracking sensors (e.g., a gaze tracking system based on an image sensor and, if desired, a light source that emits one or more beams of light that are tracked using the image sensor after reflecting from a user's eyes), touch sensors, capacitive proximity sensors, light-based (optical) proximity sensors, other proximity sensors, force sensors, sensors such as contact sensors based on switches, gas sensors, pressure sensors, moisture sensors, magnetic sensors, ambient light sensors, audio sensors (e.g., microphones for gathering voice commands and other audio input), sensors that are configured to gather information on motion, position, and/or orientation (e.g., accelerometers, gyroscopes, compasses, and/or inertial measurement units that include all of these sensors or a subset of one or two of these sensors), and/or other sensors.

User input and other information may be gathered using sensors and other input devices in input-output devices 22. If desired, input-output devices 22 may include haptic output devices (e.g., vibrating components), light-emitting diodes and other light sources, speakers such as ear speakers and other speakers for producing audio output, joysticks, buttons, and/or other components. If desired, device 10 may include a battery such as battery 24. Battery 24 may be used in powering circuitry in device 10 and/or may be used in supplying supplemental battery power to other devices 10 (e.g., when device 10A is a battery pack, a battery case for device 10B, etc.). As shown in FIG. 3, device 10 (and/or cable 14) may contain wireless power circuitry 26. Circuitry 26 may include wireless power coils and/or other circuits for receiving and/or transmitting wireless power. If desired, connectors 16 at one or both ends of cable 14 may have circuitry such as circuitry 26 that handles wireless power transmission operations with corresponding wireless power circuitry 26 in one or more of devices 10 (e.g., so that power can be transferred wirelessly between devices 10 and connectors 16).

Electronic device 10 may have support structures (e.g., housing walls, straps, etc.). In configurations in which electronic device 10 is a head-mounted device (e.g., a pair of glasses, goggles, a helmet, a hat, etc.), the support structures may include head-mounted support structures (e.g., a helmet housing, head straps, temples in a pair of eyeglasses, goggle housing structures, and/or other head-mounted structures). As an example, the head-mounted support structures for device 10B may have an associated strap 12, as shown in FIG. 1. The head-mounted support structures (e.g., a head-mounted housing, etc.) may be configured to be worn on a head of a user during operation of device 10 and may support circuitry such as displays, sensors, other input-output devices 22, control circuitry 20, etc. In some configurations, device 10 may include only a subset of the components of FIG. 3 (e.g., device 10 may include battery 24 but no wireless power circuitry 26, may include no input-output devices 22, and/or other may include other subsets of the components of FIG. 3).

Figure 4:
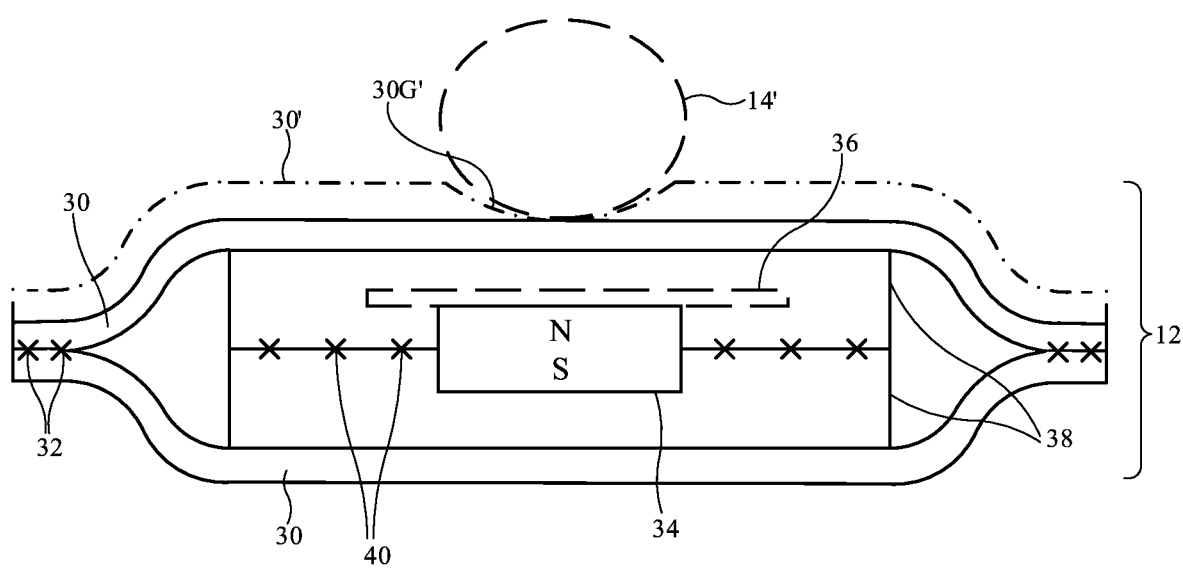
FIG. 4 is a cross-sectional side view of an illustrative strap in accordance with an embodiment.

FIG. 4 is a cross-sectional side view of an illustrative flat strap. As shown in FIG. 4, strap 12 may have a magnetic structure (see, e.g., magnet 34) extending along some or all of the length of strap 12 (e.g., into the page in the orientation of FIG. 4). The magnetic structure may be a continuous strip-shaped member or may have discrete segments. One or more magnets (e.g., a series of discrete permanent magnets separated by gaps or mounted immediately adjacent to each other) may be used in forming the magnetic structure and/or magnetized magnetic material may be used in forming a continuous or semi-continuous flexible strip-shaped magnetic structure.

An example of magnetic material that may be magnetized to form a strip-shaped magnetic structure for strap 12 is polymer (e.g., elastomeric polymer such as silicone, thermoplastic polyurethane, or other flexible material) with embedded magnetic particles (e.g., sintered magnetic particles such as particles of NdFeB) or other suitable magnetic material that is magnetized to form a flexible permanent magnet. The permanent magnet may produce magnetic fields that attract cable 14 to a position such as position 14' of FIG. 4.

Cable 14 may have structures that are attracted to strap 12. For example, cable 14 may have one or more flexible and/or rigid permanent magnets (e.g., magnets that attract corresponding magnets in strap 12 and/or that attract non-magnetized magnetic material in strap 12). In an illustrative configuration, which may sometimes be described herein as an example, strap 12 contains one or more permanent magnets that produce magnetic fields and cable 14 includes magnetic material that is not permanently magnetized, but that is magnetically attracted towards the magnetic fields produced by the magnet(s) of strap 12. The magnetic material in cable 14 may be formed from magnetic particles embedded in elastomeric polymer such as silicone, thermoplastic polyurethane, or other flexible material and/or may be formed from steel wires or other structures containing iron or other magnetic material.

As shown in FIG. 4, strap 12 may have one or more layers of structures that form the body of strap 12. These layers may include, for example, inner members 38. Members 38 may be strip-shaped elongated members formed from flexible material such as polymer, fabric, leather, bonded leather (e.g., pieces of leather such as scrap leather pieces and/or other leather fibers bonded together with fibers of paper, polymer, and/or other material using polymer binder), and/or other flexible elongated members. Members 38 may be mating upper and lower elongated planer stripes of material that are bonded together to enclose and support magnet 34 using adhesive 40 or other attachment mechanisms (e.g., stiches of fiber, welds, fasteners, etc.). If desired, an optional stiffener such as stiffener 36 may be incorporated into strap 12 (e.g., adjacent to magnet 34). Stiffener 36 may be formed from flexible polymer with a higher elastic modulus than the polymer or other flexible material used in forming layers 38 (as an example). An optional outer cover may be provided for strap 12 using one or more additional layers of material. In the example of FIG. 4, strap 12 has mating upper and lower outer layers 30. Layers 30 may form cosmetic exterior portions of strap 12 that enclose layers 38 and magnet 34 and may be formed from materials such as leather, bonded leather, fabric, polymer, etc. Layers 30 may, if desired, be sewn together along their edges using stitches 32 and/or may be attached along their edges using fasteners, adhesive, welds, and/or other attachment mechanisms. If desired, adhesive may be used to help attach layers 30 to layers 38.

One or more of the layers of strap 12 may be provided with longitudinal recesses to receive cable 14. As an example, an upper one of layers 30 may be located in position 30' and may be provided with a groove such as groove 30G' that receives and guides cable 14 (e.g., to help hold cable 14 in position 14'). In flat straps, the ratio of the strap width (horizontal dimension of strap 12 of FIG. 4) to the strap thickness (vertical dimension of strap 12 of FIG. 4) is generally at least 4, at least 8, at least 15, less than 100, less than 40, or other suitable value. If desired, strap 12 may have other shapes (e.g., circular shapes, other shapes with opposing non-flat surfaces, etc.). The example of FIG. 4 is illustrative.

Figure 5:
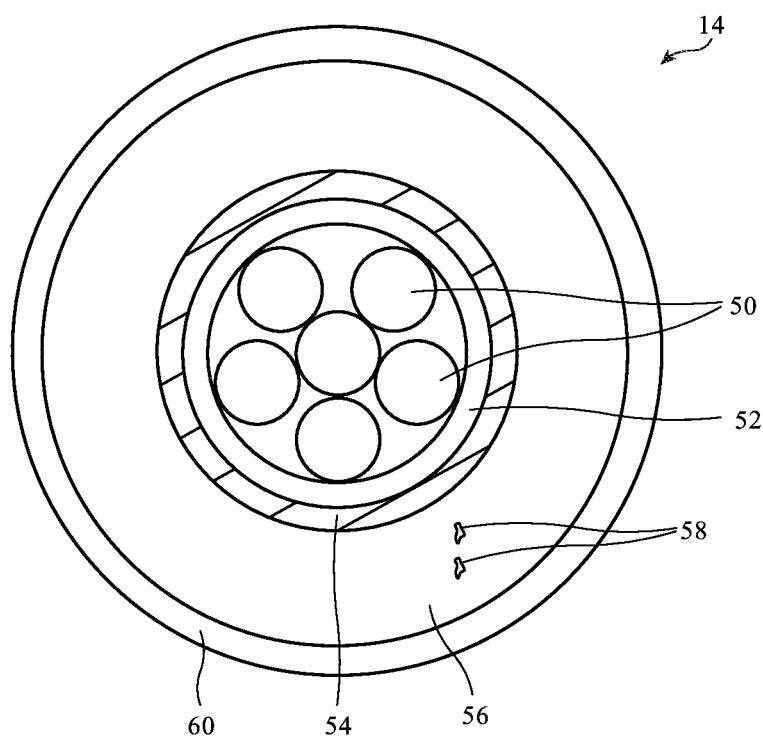
FIG. 5 is a cross-sectional side view of an illustrative round cable in accordance with an embodiment.

FIG. 5 is a cross-sectional side view of cable 14. In the illustrative configuration of FIG. 5, cable 14 has a conductive core surrounded by additional layers. There may, in general, be one or more, two or more, three or more, four or more, fewer than ten, fewer than seven, or other suitable number of layers surrounding the core of cable 14. The core and each of the layers surrounding the core may include conductive materials (e.g., for conveying power and/or data signals), may include dielectric (e.g., to insulate conductive materials), and/or may include magnetic material (e.g., material that is attracted to the magnetic fields produced by strap 12 or magnetic fields produced by device 10 and/or other equipment in system 8 with magnets).

In the example of FIG. 5, the core of cable 14 contains multiple strands of material such as strands 50. Each of strands 50 may include a single filament or strands 50 may be multifilament strands. Strands 50 may be conductive (e.g., strands of metal forming metal wires) and/or may be magnetic (e.g., the strands may be formed from iron or other magnetic material that is attracted to magnetic fields and that is optionally also conductive for carrying data and/or power signals such as a positive power supply signal and/or a ground power signal). Strands 50 may be bare or insulated.

In an illustrative configuration, strands 50, which may sometimes be referred to as signal lines or signal paths, are insulated (e.g., with polymer coatings) and carry one or more respective positive power supply voltages, carry a ground power supply voltage, and/or carry data signals. There may be, at least two, at least five, at least ten, fewer than eight, fewer than four, fewer than three, or other suitable number of power lines formed from respective strands 50 and at least two, at least five, at least ten, fewer than eight, fewer than four, fewer than three, or other suitable number of data lines formed from respective strands 50. If desired, other structures in cable 14 (e.g., one or more layers surrounding the core of cable 14) may be formed from conductive material and may serve as a ground line, positive power supply line, and/or data line.

In the FIG. 5 arrangement, the core formed from strands 50 is surrounded by layer 52. Layer 52 may be a layer of polymer tape wrapped about strands 50 in a spiral pattern or other dielectric layer (e.g., an extruded polymer layer) that helps insulate strands 50.

Layer 54 may be a strengthening layer formed from braided strands of material. The braided strands may be, for example, polymer and/or steel (e.g., layer 54 may form a braided steel jacket having wires that contain magnetic material such as iron). Layer 54 may form a conductive material (e.g., to form a ground or electromagnetic shield). To ensure low resistance for layer 54, low-resistance wires such as copper wires may be intertwined and/or interlaced with other strands of material (e.g., steel wires or other wires having a greater resistance than the low-resistance wires). Configurations in which layer 54 is formed using electroformed copper with magnetic material or electroformed magnetic material with copper may also be used, if desired.

An insulating layer such as layer 56 may surround layer 54. Layer 56 may be formed from a flexible material such as an elastomeric polymer (e.g., thermoplastic polyurethane or silicone). Optional magnetic particles 58 (e.g., rare earth magnetic particles such as neodymium iron boron particles or other particles of magnetic material) may be embedded in layer 56 (e.g., in the polymer of layer 56) to help provide cable 14 with magnetic material that is attracted to magnetic fields. Magnetic material such as particles 58 may be provided in addition to or instead of magnetic material in other portions of cable 14 (e.g., magnetic material in one or more of strands (wires) 50, magnetic material in the wires and/or other structures of layer 54, and/or magnetic material in other layers.

An optional outer layer for cable 14 such as outer layer 60 may be provided to help enhance the wear properties and appearance of cable 14. Layer 60 may be, as an example, a braided layer such as a braided fabric formed from polyethylene terephthalate strands (e.g. a circular braid) and/or may include an extruded polymer tube. The use of outer layer 60 may allow insulating layer 56 to be formed from a soft polymer that enhances the bendability of cable 14.

Magnetic material may be incorporated into any one or more of the structures of cable 14. For example, one or more of strands 50 may include magnetic material (e.g., iron wires, polymer coatings with embedded magnetic material particles), one or more of the layers on strands 50 (e.g., layers formed from wrapped polymer tape, extruded polymer tubes, fabric layers, etc.) may also include magnetic material (e.g., particles of magnetic material embedded in polymer, etc.).

Figure 6:
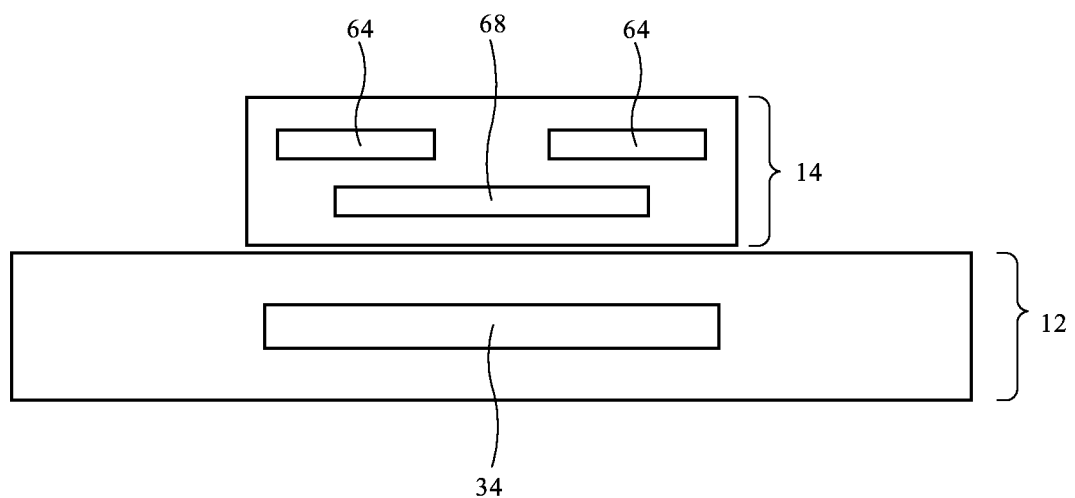
FIG. 6 is a cross-sectional side view of an illustrative flat cable and associated strap in accordance with an embodiment.

Cable 14 may be round (e.g., cable 14 may have a circular cross-sectional profile) or may be flat or have other shapes. An illustrative flat cable is shown in FIG. 6. As shown in FIG. 6, cable 14 may be attracted to magnet 34 in strap 12, so that cable 14 lies flat on a corresponding flat outer surface of strap 12. Flat cables such as flat cable 14 of FIG. 6 may have two or more flat conductors 64 (e.g., at least two, at least four, at least eight, fewer than ten, or other suitable number) and/or may have conductors of other shapes (e.g., round wires, etc.). Conductive strips such as conductors 64 may be formed from metal (e.g., metal foil strips, metal fabric such as braided metal or other interlaced metal strands, a double spiral of wrapped thin metal wires (e.g., non-woven wires), etc.), and/or other conductive material. Conductors 64 may form signal lines for power and/or data signals and may be insulated by one or more dielectric layers (e.g., layers formed from elastomeric polymer and/or other dielectrics. The structures of conductors 64 and other layers of cable 14 of FIG. 6 may include magnetic material (e.g., magnetic particles embedded in elastomeric polymer as described in connection with layer 56 of FIG. 5) so that cable 14 is attracted to magnetic fields.

If desired, devices 10 may be provided with permanent magnets (e.g., discrete magnets, patches or strips of flexible magnet material in which magnetic particles are embedded in polymer, magnetic material that extends under part or all of the housing of devices 10, etc.). This allows cable 14 to be attracted to the surface of devices 10 for storage.

Figure 7:
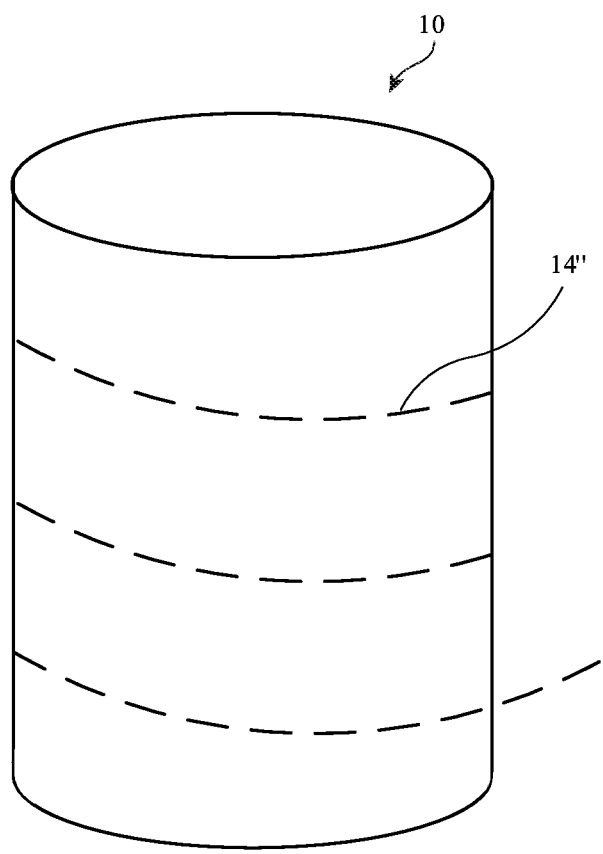
FIG. 7 is a perspective view of an illustrative item such as a speaker, battery pack, or other electronic device that is configured to receive a cable for storage in accordance with an embodiment.

An illustrative configuration for device 10 in which device 10 contains magnets that produce magnetic fields that attract cable 14 is shown in FIG. 7. In the example of FIG. 7, the housing of device 10 has curved surfaces (e.g., housing walls with curved cross-sectional profiles). Device 10 may, as an example, have a portion with a cylindrical shape (e.g., device 10 may be a cylindrical voice-controlled speaker, a cylindrical battery pack, a removable battery case for a device that has a cylindrical portion or other portion with a curved surface, and/or other electronic device with a housing surface suitable to attract cable 14). The inclusion of magnetics under the housing of device 10 of FIG. 7 allows device 10 to produce magnetic fields that attract and hold cable 14 in place (e.g., so that cable 14 may be wrapped around device 10 along a path such as illustrative path 14" of FIG. 7 or may be otherwise held against the surface of device 10).

Figure 8:
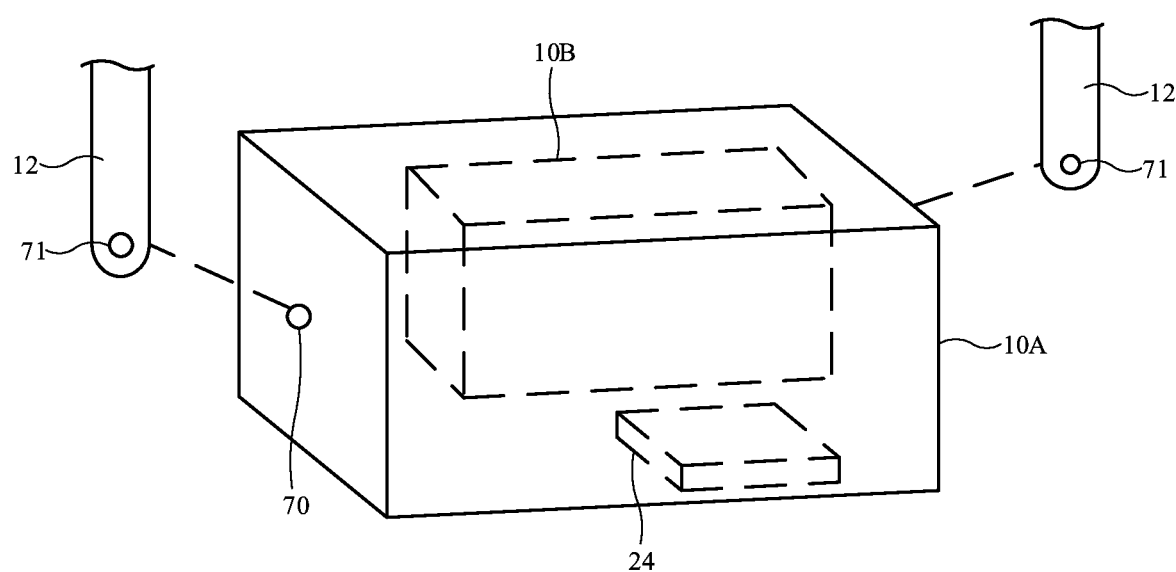
FIG. 8 is a perspective view of an illustrative electronic device and associated removable case in accordance with an embodiment.

Electronic devices 10 may include removable carrying cases such as battery cases. As an example, device 10A of FIG. 1 may be a removable carrying case that is configured to receive device 10B of FIG. 1 for storage. An illustrative arrangement of this type is shown in FIG. 8. As shown in FIG. 8, device 10A may be a removable battery case for storing device 10B when device 10B is not being worn on a head of a user or otherwise being used by the user. Battery 24 of device 10A may provide device 10B with battery power to recharge a battery in device 10B and/or to power other circuitry in device 10B. When device 10B is stowed in the interior of device 10A as shown in FIG. 8, battery 24 may provide power to device 10B though a wired or wireless power connection in the interior of device 10A. When device 10 is being used outside of device 10A, cable 14 may be used to route power between battery 24 and device 10B. As shown in FIG. 8, device 10A may be carried by straps 12. Straps 12 may be attached to device 10A using magnets 71 in straps 12 and corresponding magnets 70 in device 10A and/or using snaps or other mating attachment structures. If desired, device 10A (a supplemental battery pack, removable battery case, or other device) may be held in a user's hand or carried in a pocket of a user's clothing, cable 14 may be used to couple device 10A to device 10B (e.g., while device 10B is being worn on the user's head), and one or all of straps 12 may be omitted. Device 10B and device 10A may therefore be used either with or without straps 12.

Figure 9:
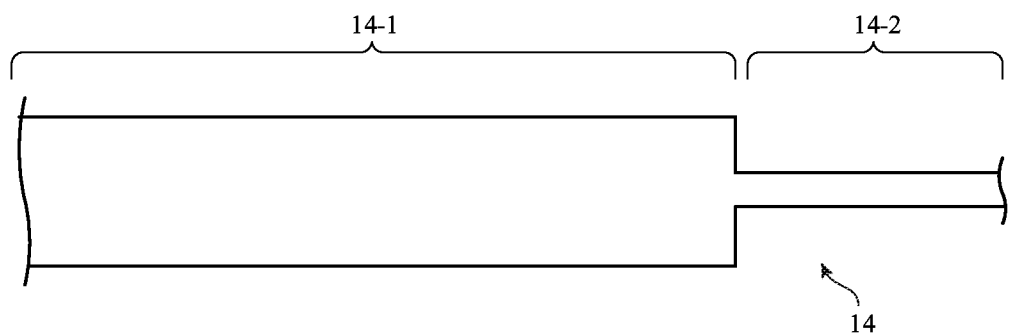
FIG. 9 is a top view of an illustrative cable having portions with different cross-sectional profiles in accordance with an embodiment.

As shown in FIG. 9, cable 14 may have different shapes and/or sizes along its length. In the example of FIG. 9, portion 14-1 and portion 14-2 have different cross-sectional profiles. For example, portion 14-1 may be a flat cable segment that has a thin rectangular cross-sectional shape (see, e.g., flat cable 14 of FIG. 6) and portion 14-2 may be a round cable segment (see, e.g., round cable 14 of FIG. 5).

Figure 10:
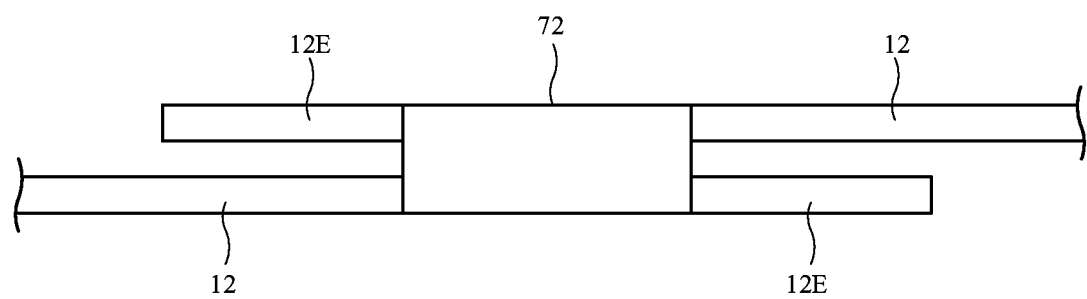
FIG. 10 is a side view of an illustrative strap having a buckle and self-attracting magnetic structures in accordance with an embodiment.

FIG. 10 is a cross-sectional side view of strap 12 in an illustrative configuration where two ends of strap 12 are being joined by a buckle. As shown in FIG. 10, buckle 72 may help hold an upper portion of strap 12 in place relative to a lower portion of strap 12. In arrangements in which strap 12 is magnetic, the magnets of strap 12 may help hold loose ends 12E of strap 12 against adjacent portions of strap 12.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

Physical environment: A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

Computer-generated reality: in contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations (e.g., for accessibility reasons), adjustments to characteristic(s) of virtual object(s) in a CGR environment may be made in response to representations of physical motions (e.g., vocal commands). A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects. Examples of CGR include virtual reality and mixed reality.

Virtual reality: A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

Mixed reality: In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end. In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground. Examples of mixed realities include augmented reality and augmented virtuality. Augmented reality: an augmented reality (AR) environment refers to a simulated environment in which one or more virtual objects are superimposed over a physical environment, or a representation thereof. For example, an electronic system for presenting an AR environment may have a transparent or translucent display through which a person may directly view the physical environment. The system may be configured to present virtual objects on the transparent or translucent display, so that a person, using the system, perceives the virtual objects superimposed over the physical environment. Alternatively, a system may have an opaque display and one or more imaging sensors that capture images or video of the physical environment, which are representations of the physical environment. The system composites the images or video with virtual objects, and presents the composition on the opaque display. A person, using the system, indirectly views the physical environment by way of the images or video of the physical environment, and perceives the virtual objects superimposed over the physical environment. As used herein, a video of the physical environment shown on an opaque display is called "pass-through video," meaning a system uses one or more image sensor(s) to capture images of the physical environment, and uses those images in presenting the AR environment on the opaque display. Further alternatively, a system may have a projection system that projects virtual objects into the physical environment, for example, as a hologram or on a physical surface, so that a person, using the system, perceives the virtual objects superimposed over the physical environment. An augmented reality environment also refers to a simulated environment in which a representation of a physical environment is transformed by computer-generated sensory information. For example, in providing pass-through video, a system may transform one or more sensor images to impose a select perspective (e.g., viewpoint) different than the perspective captured by the imaging sensors. As another example, a representation of a physical environment may be transformed by graphically modifying (e.g., enlarging) portions thereof, such that the modified portion may be representative but not photorealistic versions of the originally captured images. As a further example, a representation of a physical environment may be transformed by graphically eliminating or obfuscating portions thereof. Augmented virtuality: an augmented virtuality (AV) environment refers to a simulated environment in which a virtual or computer generated environment incorporates one or more sensory inputs from the physical environment. The sensory inputs may be representations of one or more characteristics of the physical environment. For example, an AV park may have virtual trees and virtual buildings, but people with faces photorealistically reproduced from images taken of physical people. As another example, a virtual object may adopt a shape or color of a physical article imaged by one or more imaging sensors. As a further example, a virtual object may adopt shadows consistent with the position of the sun in the physical environment.

Hardware: there are many different types of electronic systems that enable a person to sense and/or interact with various CGR environments. Examples include head mounted systems, projection-based systems, heads-up displays (HUDs), vehicle windshields having integrated display capability, windows having integrated display capability, displays formed as lenses designed to be placed on a person's eyes (e.g., similar to contact lenses), headphones/earphones, speaker arrays, input systems (e.g., wearable or handheld controllers with or without haptic feedback), smartphones, tablets, and desktop/laptop computers. A head mounted system may have one or more speaker(s) and an integrated opaque display. Alternatively, a head mounted system may be configured to accept an external opaque display (e.g., a smartphone). The head mounted system may incorporate one or more imaging sensors to capture images or video of the physical environment, and/or one or more microphones to capture audio of the physical environment. Rather than an opaque display, a head mounted system may have a transparent or translucent display. The transparent or translucent display may have a medium through which light representative of images is directed to a person's eyes. The display may utilize digital light projection, OLEDs, LEDs, µLEDs, liquid crystal on silicon, laser scanning light sources, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

The foregoing is merely illustrative and various modifications can be made to the described embodiments. The foregoing embodiments may be implemented individually or in any combination.

What is claimed is:

1. An electronic device strap configured to couple to an electronic device and configured to magnetically attract a cable, comprising:
   an elongated strip-shaped flexible magnet formed from magnetic particles embedded in polymer;
   first and second layers on opposing sides of the elongated strip-shaped flexible magnet that are configured to enclose the elongated strip-shaped flexible magnet;
   a third layer adjacent to the first layer; and
   a fourth layer adjacent to the second layer, wherein the third and fourth layers have attached edges and are configured to enclose the first and second layers and the elongated strip-shaped flexible magnet.

2. The electronic device strap defined in claim 1 wherein the first and second layers comprise polymer with embedded fibers and are attached with adhesive and wherein the third and fourth layers are formed from a material different from the first and second layers.

3. The electronic device strap defined in claim 2 wherein the embedded fibers comprise leather fibers and wherein the material from which the third and fourth layers are formed comprises a material selected from the group consisting of: polymer, leather, and fabric.

4. The electronic device strap defined in claim 1 wherein the third and fourth layers comprise leather.

5. The electronic device strap defined in claim 1 wherein the third layer has a groove configured to removably receive the cable.

6. The electronic device strap defined in claim 1 wherein the electronic device comprises a head-mounted device, the electronic device strap further comprising a strip-shaped stiffener that extends along the elongated strip-shaped flexible magnet.

7. The electronic device strap defined in claim 1 further comprising magnets configured to attach the electronic device strap to the electronic device.

8. The electronic device strap defined in claim 1 wherein the first and second layers comprise bonded leather.

9. The electronic device strap defined in claim 1 wherein the magnetic particles comprise neodymium iron boron.

10. A cable having a first end configured to couple to a first electronic device comprising a battery and a second end configured to couple to a second electronic device comprising a head-mounted device to convey power between the first and second electronic devices, wherein the head-mounted device has a strap with a magnet, and wherein the cable is configured to be magnetically attracted to the magnet, the cable comprising:
- a core having conductive lines configured to convey signals between the first and second electronic devices, wherein the conductive lines include a power line to convey power from the battery to the head-mounted device; and
- a polymer layer surrounding the core with embedded particles of magnetic material that are configured to be attracted to magnetic fields.

11. The cable defined in claim 10 further comprising a braided wire jacket surrounding the core.

12. The cable defined in claim 11 wherein the braided wire jacket comprises steel wires and copper wires.

13. The cable defined in claim 10 wherein the polymer layer comprises an elastomeric polymer selected from the group consisting of: silicone and thermoplastic polyurethane.

14. The cable defined in claim 10 wherein the conductive lines include a wire formed from magnetic material.

15. The cable defined in claim 14 wherein the magnetic material of the wire comprises iron.

16. An electronic device, comprising:
- a housing;
- input-output devices in the housing; and
- a magnetic strap that is coupled to the housing and that comprises an elongated flexible magnet configured to attract a removable cable containing power lines, wherein the input-output devices are configured to receive power over the power lines of the removable cable while the removable cable is attracted to the magnetic strap.

17. The electronic device defined in claim 16 wherein the elongated flexible magnet comprises polymer with embedded magnetic particles.

18. The electronic device defined in claim 17 wherein the input-output devices comprise a display.

19. The electronic device defined in claim 18 wherein the housing comprises a head-mounted housing and wherein the input-output devices are configured to receive power over the power lines of the removable cable from a battery in external equipment.

20. An electronic device strap configured to couple to an electronic device and configured to magnetically attract a cable, comprising:
- first and second elongated layers;
- a series of discrete permanent magnets between the first and second elongated layers and extending along the first and second elongated layers;
- a third layer adjacent to the first elongated layer; and
- a fourth layer adjacent to the second elongated layer, wherein the third and fourth layers have attached edges and are configured to enclose the first and second elongated layers and the series of discrete permanent magnets.

21. The electronic device strap defined in claim 20 wherein the third and fourth layers comprise leather.

22. The electronic device strap defined in claim 20 wherein the first and second elongated layers comprise bonded leather.

23. The electronic device strap defined in claim 20 further comprising magnets configured to attach the electronic device strap to the electronic device.

24. The electronic device strap defined in claim 20 wherein the electronic device comprises a head-mounted device, the electronic device strap further comprising a strip-shaped stiffener that extends along the first and second elongated layers.

25. An electronic device strap configured to couple to an electronic device and configured to magnetically attract a cable, comprising:
- a flexible magnet formed from magnetic particles embedded in polymer;
- first and second layers on opposing sides of the flexible magnet that are configured to enclose the flexible magnet;
- a third layer adjacent to the first layer; and
- a fourth layer adjacent to the second layer, wherein the third and fourth layers have attached edges and are configured to enclose the first and second layers and the flexible magnet.

* * * * *